(12) United States Patent
Hwang et al.

(10) Patent No.: US 9,504,153 B2
(45) Date of Patent: Nov. 22, 2016

(54) PAD STRUCTURE AND DISPLAY DEVICE HAVING THE SAME

(71) Applicant: LG DISPLAY CO., LTD., Seoul (KR)

(72) Inventors: SoonJae Hwang, Paju-si (KR); Ilgi Jeong, Chungcheongbuk-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/869,596

(22) Filed: Sep. 29, 2015

(65) Prior Publication Data

US 2016/0100483 A1 Apr. 7, 2016

(30) Foreign Application Priority Data

Oct. 2, 2014 (KR) ........................ 10-2014-0132959

(51) Int. Cl.
| | |
|---|---|
| H01J 1/62 | (2006.01) |
| H05K 1/11 | (2006.01) |
| G02F 1/1345 | (2006.01) |
| H01L 23/485 | (2006.01) |
| H01L 23/00 | (2006.01) |
| H05B 33/06 | (2006.01) |
| H05K 1/02 | (2006.01) |
| H05K 3/40 | (2006.01) |
| G02F 1/1362 | (2006.01) |
| H01L 23/538 | (2006.01) |
| H01L 21/768 | (2006.01) |
| H01L 27/12 | (2006.01) |
| H05K 3/36 | (2006.01) |

(52) U.S. Cl.
CPC ........... *H05K 1/111* (2013.01); *G02F 1/13458* (2013.01); *G02F 1/136286* (2013.01); *H01L 21/76816* (2013.01); *H01L 23/485* (2013.01); *H01L 24/05* (2013.01); *H05B 33/06* (2013.01); *H05K 1/0298* (2013.01); *H05K 3/4007* (2013.01); *G02F 1/136227* (2013.01); *G02F 2001/13629* (2013.01); *G02F 2201/42* (2013.01); *H01L 21/76804* (2013.01); *H01L 23/538* (2013.01); *H01L 27/1244* (2013.01); *H05K 1/115* (2013.01); *H05K 3/361* (2013.01); *H05K 2201/09227* (2013.01); *H05K 2201/10128* (2013.01)

(58) Field of Classification Search
CPC ................... G02F 1/134458; H01L 21/76816
USPC ......................... 313/506, 505, 498
See application file for complete search history.

(56) References Cited

U.S. PATENT DOCUMENTS 6,559,548 B1 5/2003 Matsunaga et al.
2007/0046336 A1 3/2007 Kang et al.

FOREIGN PATENT DOCUMENTS

EP 0 913 719 A2 5/1999
JP 2008-203593 A 9/2008

*Primary Examiner* — Vip Patel
(74) *Attorney, Agent, or Firm* — Birch, Stewart, Kolasch & Birch, LLP

(57) ABSTRACT

A display device includes a plurality of signal lines arranged in a display area of a substrate and a pad structure located at a non-active area and connected with the signal lines. The pad structure includes a plurality of metal layers and two or more insulating layers located between the metal layers and having one or more contact hole which makes two metal layers among the metal layers contacted with each other, and the contact holes respectively located in the insulating layers are not overlapped with each other.

13 Claims, 23 Drawing Sheets

PAD STRUCTURE AND DISPLAY DEVICE HAVING THE SAME

CROSS-REFERENCE TO RELATED APPLICATION

This application claims priority from and the benefit under 35 U.S.C. §119(a) of Korean Patent Application No. 10-2014-0132959, filed on Oct. 2, 2014, which is hereby incorporated by reference for all purposes as if fully set forth herein.

BACKGROUND OF THE INVENTION

1. Field of the Invention

The present invention relates to a pad structure and a display device having the same.

2. Description of the Related Art

There continues to study for developing a performance of various flat panel displays such as thickness slimming, weight lightening, low power consumption and the like.

Various flat panel displays such as a liquid crystal display device (LCD), a plasma display panel device (PDP), a field emission display device (FED), an electro luminescence display device (ELD), an electro-wetting display device (EWD) and an organic light emitting display device (OLED) have been used recently.

In general, the flat panel display includes a display panel, a gate driver, a data driver, a timing controller and a voltage generator. The display panel defines each pixel at each crossing portion of a plurality of gate lines and a plurality of data lines. The gate driver drives a plurality of gate lines. The data driver includes a plurality of data driving integrated circuits which drive the plurality of data lines. The timing controller provides the gate and the data drivers with various control signals. The voltage generator generates reference voltages and provides the data driver with them.

The gate driver may be built in a non-active area of the display panel and the plurality of the data driving integrated circuits are mounted on a film in a manner of a chip on film (COF) in order to reduce the volume of the flat panel display and the manufacturing cost.

Various signal line, the gate driver, the data line and the like are integrated into the display device, and trend to minimize them. Accordingly, the design margin required for the manufacturing process of the components becomes insufficient and precise alignment technique is required.

In case of the data driver, two or more contact holes are formed so that the design margin shortage may result in increasing the contact resistance according to minimization of the contact hole. A steep step is caused by overlapping the contact holes so that there may happen the disconnection defect between the data driving integrated circuit and the film on which it is mounted.

SUMMARY OF THE INVENTION

In accordance with one embodiment, a display device may comprise a plurality of signal lines arranged in a display area of a substrate and a pad structure located at a non-active area and connected with the signal lines.

The pad structure may comprise two or more metal layers and an insulating layer located between the metal layers and having one or more contact hole which makes two metal layers among the metal layers contacted with each other, and the contact holes respectively located in the insulating layers are not overlapped with each other.

In accordance with another embodiment, a pad structure may comprise two or more metal layers and an insulating layer located between the metal layers and having one or more contact hole which makes two metal layers among the metal layers contacted with each other.

The contact holes respectively located in the insulating layers may be not overlapped with each other.

DETAILED DESCRIPTION OF THE EMBODIMENTS

Figure 1:
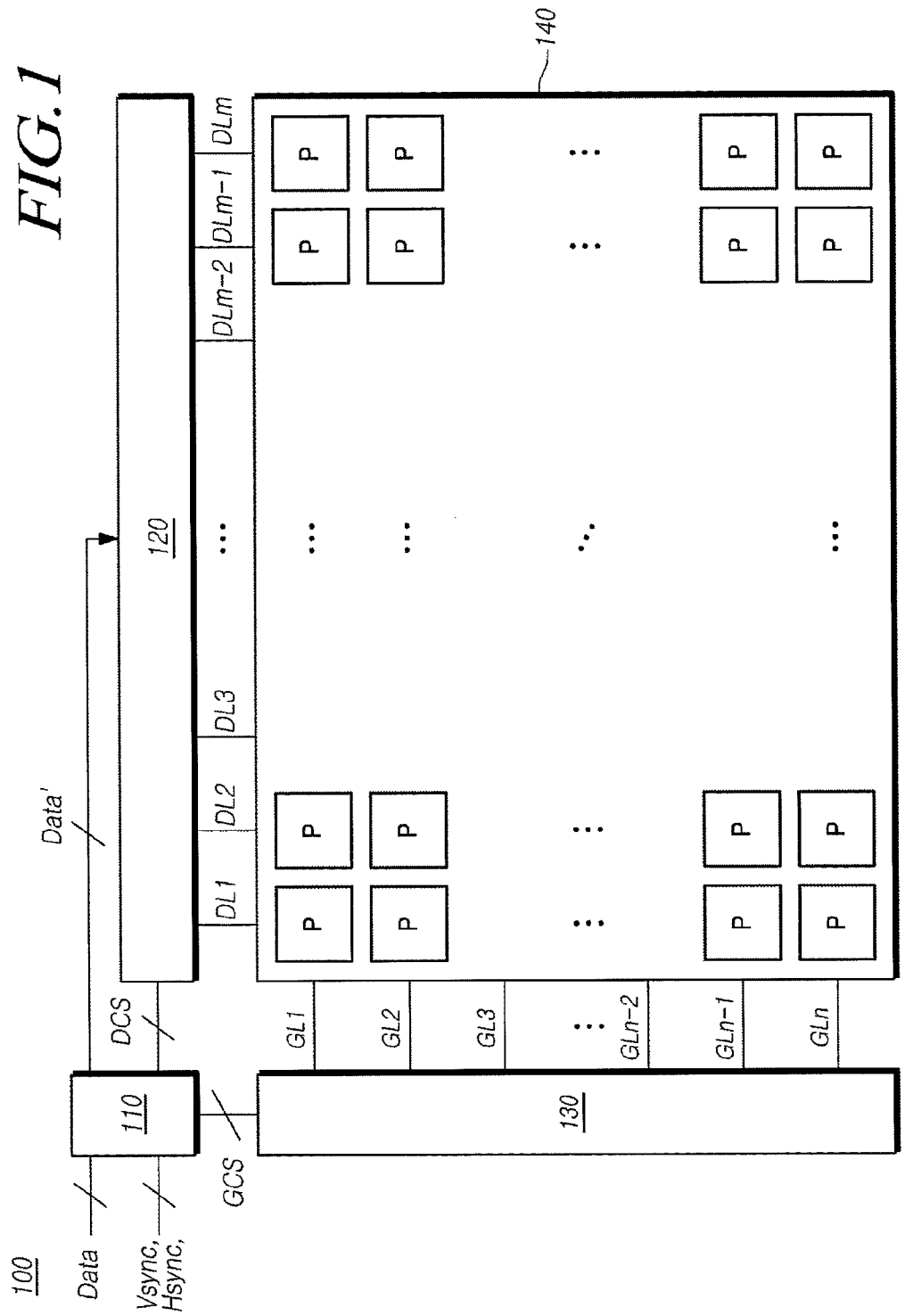
FIG. 1 is a schematic system configuration view of a display device according to embodiments of the present invention.

Hereinafter, a few embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order sequence or number of a corresponding component but used merely to distinguish the corresponding component from other component(s). It should be noted that if it is described in the specification that one component is "connected," "coupled" or "joined" to another component, a third component may be "connected," "coupled," and "joined" between the first and second components, although the first component may be directly connected, coupled or joined to the second component.

FIG. 1 is a schematic system configuration view of a display device according to embodiments.

Referring to FIG. 1, the display device 100 according to various embodiments includes a display panel 140 including m (here, m is a natural number) data lines DL1, ..., and DLm and n (here, n is a natural number) gate lines GL1, ..., and GLn, a data driver 120 driving the m data lines DL1, ..., and DLm, a gate driver 130 sequentially driving the n gate lines GL1, ..., and GLn, and a timing controller 110 controlling the data driver 120 and the gate driver 130.

First, the timing controller 110 outputs a Data Control Signal (DCS) for controlling the data driver 120 and a Gate Control Signal (GCS) for controlling the gate driver 130, based on an external timing signal, such as a vertical/horizontal synchronizing signal (Vsync and Hsync), image data, a clock signal (CLK), and the like. Also, the timing controller 110 converts image data (Data) input from a host system into a data signal format that is used in the data driver 120, and provides the converted image data (Data') to the data driver 120.

In response to a DCS and the converted image data (Data') input from the timing controller 110, the data driver 120 converts the image data (Data') to a data signal (analog pixel signal or data voltage), which is a voltage value corresponding to a gray scale value, and provides the same to a data line (DL1~DLm).

The data driver 120 stores the input image data Data' in a memory (not shown), converts the corresponding image data Data' into a data voltage Vdata of an analog form, and provides the data voltage Vdata to the m data lines DL1, ..., and DLm to drive the m data lines DL1, ..., and DLm, when a specific gate line is activated, according to the control of the timing controller 110.

The data driver 120 may include a plurality of data drive integrated circuits (also referred to as source drive integrated circuits). The plurality of data drive integrated circuits may be connected with a bonding pad of the display panel through a Tape Automated Bonding (TAB) method or a Chip On Glass (COG) method or directly formed in the display panel 140. Occasionally, the plurality of data drive integrated circuits may be integrated and formed in the display panel 140.

Such display device 100 may include a pad structure in a non-active area of the display panel 140 to be connected with the plurality of signal lines GL and DL arranged in an active area thereof. Here, the pad structure may include two or more metal layers, and an insulating layer located between the metal layers and having one or more contact hole which makes two metal layers among the metal layers contacted with each other. The contact holes respectively located in the insulating layers are not overlapped with each other.

The gate driver 130 sequentially supplies a scan signal (a gate pulse or a scan pulse, and a gate-on signal) to a gate line (GL1~GLn) in response to the GCS input from the timing controller 110.

The above-mentioned gate driver 130 may be positioned on only one side of the display panel 140 as illustrated in FIG. 1 or may be divided into two units and positioned on both sides of the display panel 140, depending on a driving scheme of the gate driver 130.

In addition, the gate driver 130 may include a plurality of gate drive integrated circuits. The plurality of gate drive integrated circuits may be connected with a bonding pad of the display panel 140 through a Tape Automated Bonding (TAB) method or a Chip On Glass (COG) method, or implemented in a Gate In Panel (GIP) type and directly formed in the display panel 140. Occasionally, a plurality of gate drive integrated circuits may be integrated and formed in the display panel 140.

Although the gate driver 130 is located on one side of the display panel 140 in a manner of a Gate In Panel (GIP), it is not limited thereto.

Each pixel (P) on the display panel 140 may be formed in a pixel area defined by the data lines (DL1~DLm) and the gate lines (GL1~GLn) and may be disposed in a matrix form, and may correspond to at least one organic light emitting device including an anode corresponding to a first electrode, a cathode corresponding to a second electrode, and an organic layer.

Figure 2:
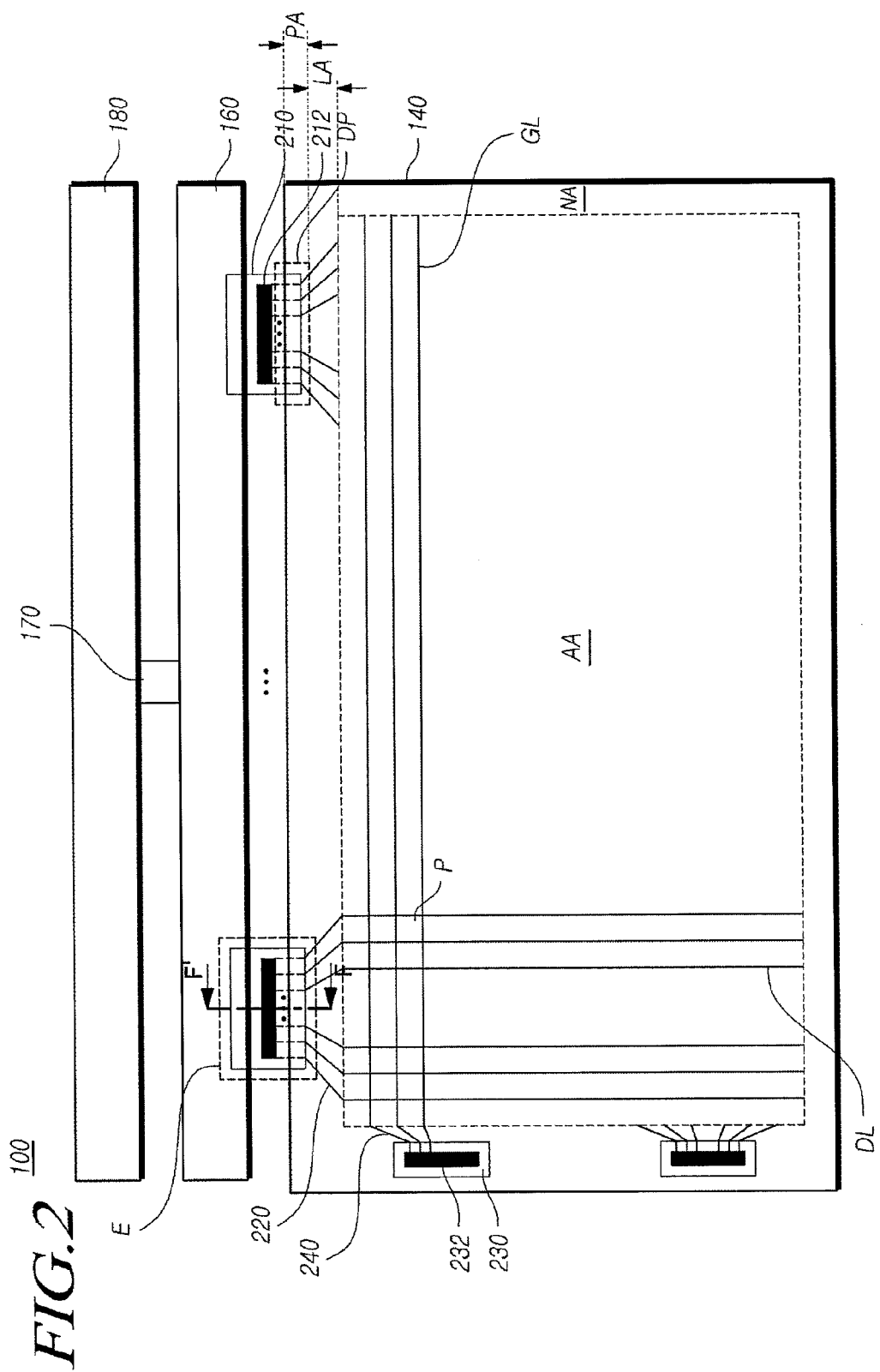
FIG. 2 is a planar view schematically illustrating the display device according to one embodiment of the present invention.

FIG. 2 is a planar view schematically illustrating the display device according to one embodiment.

FIG. 2 is an exemplary view showing a display device 100 and a pad structure included therein according to one embodiment, but it is not limited thereto.

Referring to FIG. 2, the display device 100 may include a plurality of signal lines GL and DL arranged in an active area AA on the substrate and a pad structure DP located in a non-active area NA and connected with the signal lines GL and DL.

Here, the pad structure DP may include a plurality of metal layers, and an insulating layer located between the metal layers and having one or more contact hole which makes two metal layers among the plurality of metal layers contact each other. The contact holes formed in the insulating layers are not overlapped. The plurality of the gate lines GL1 to GLn and the data lines DL1 to DLm are crossed in the active area AA.

The display panel 140 may include the active area (display area) AA and the non-active area (non-display area) NA. The non-active area may correspond to an outer area of the active area AA. The pixel P is defined at the crossing portion of each of the gate lines and the data lines.

Meanwhile, a gate driving chip or a gate driving integrated circuit 232, and a gate driving chip film 230 on which the gate driving chip 232 is integrated are located at one side of the non-active area by a mode of the Gate In Panel (GIP).

The gate driving chip film 230 may be mounted on the substrate of the display panel 140 in a manner of the Line On Glass (LOG) in order to be connected with the lines and the gate lines GL1 to GLn in the non-active area NA. Although the number of the gate driving chip 232 may be two as shown in FIG. 2, it will be increased when the display panel 140 becomes larger. When the display panel 140 becomes larger, the gate driving chip 232 may be also located on both sides of the display panel 140. This gate driving chip 232 may sequentially supply the gate signal to the gate lines GL1 to GLn through a gate line 240.

Meanwhile, a plurality of the data driving chip films 210 are arranged on one side of the non-active area NA, for example, in the upper side of the non active area in FIG. 2. One end part of the driving chip package DCP may be connected with a source printed circuit board (SPCB) 160.

The driving chip 212 may be a data driving chip or a source driving integrated circuit and built on the data driving chip film. Here, the film 210 may be a source flexible circuit film. The input ends of the data driving chip film 210 may be an anisotropic conductive film (ACF) including a conductive ball and is bonded on the source printed circuit board 160 and the substrate of the display panel 140. The data and the timing control signal may be transmitted to the driving chip 212 through the lines on the source printed circuit board 160 and the data driving chip film 210 in the manner of the Line On Film (LOF).

The driving chip 212 may receive the data from the timing controller 110, generate a data voltage using a digital to analog converter (DAC), and supply it to the data lines DL1 to DLm through a data link line.

Meanwhile, the source printed circuit board 160 may be connected with a control printed circuit board (CPCB) 180 through a flexible circuit cable 170. The control printed circuit board 180 may include the timing controller 110 and the power driving chip.

The source printed circuit board 160 includes a plurality of lines which are used to transmit electrical power and signals required for driving the driving chip 212 and the gate driving chip 232. The plurality of the source printed circuit boards 160 may be divided and bonded on the display panel 140 according to the size of the display panel 140.

The timing controller 110, the power driving chip and the like are built on the control printed circuit board 180.

The timing controller 110 outputs a Data Control Signal (DCS) to the data driving chip 212 for controlling the data driver 120 and outputs a Gate Control Signal (GCS) to the gate driving chip 232 for controlling the gate driver 130, based on an external timing signal, such as a vertical/horizontal synchronizing signal (Vsync and Hsync), image data, a clock signal (CLK), and the like received from the host system. Also, the timing controller 110 converts image data (Data) input from the host system into a data signal format that is used in the data driver 120, and provides the converted image data (Data') to the data driver 120.

Here, the host system may be any one of a TV system, a set-top box, a navigation system, a DVD player, a blu-ray display, a personal computer, a home theater system, a phone system and the like.

Meanwhile, the power driving chip may generate a power applied to the pixel, a power applied to the data driving chip 212 and the gate driving chip 232, a gamma compensation voltage(VGMA), a gate driving power such as VGH and VGL, and the like.

In the specification, the pad structure DP may be the data pad structure and the structure of the region which is located at an end port of one side in the non-active area of the display panel 140. In other words, the pad structure may mean the structure of port which is bonded to the data driving chip film 210.

Figure 3A:
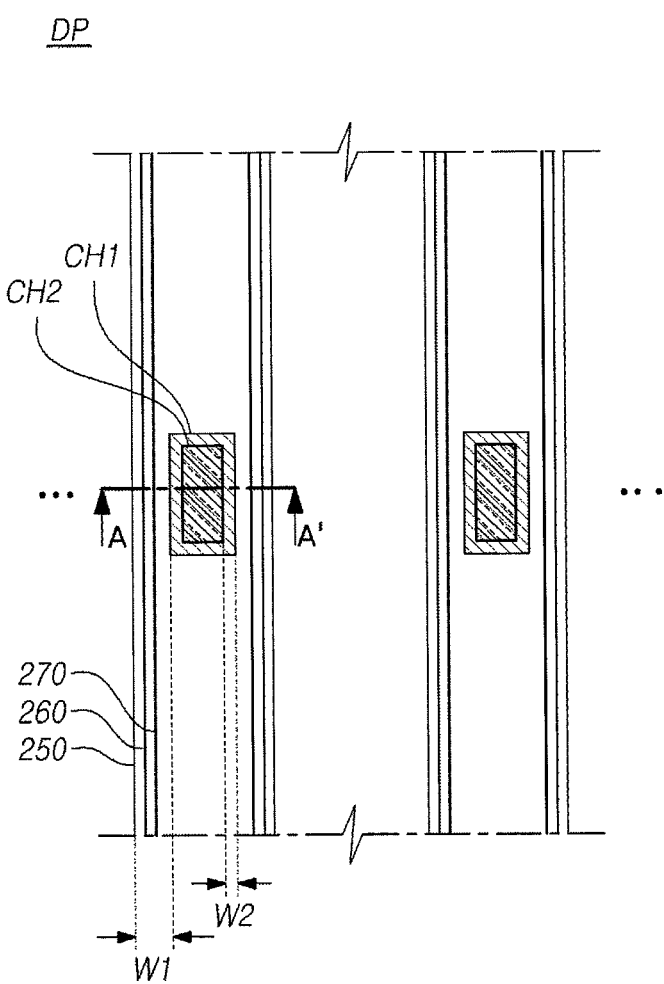
FIG. 3A is a planar view schematically illustrating the pad structure of the general display device.
Figure 3B:
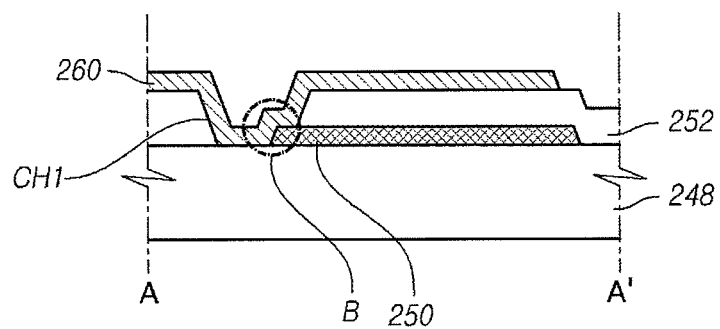
FIGS. 3B and 3C are cross-sectional views illustrating the pad structure of the general display device.
Figure 3C:
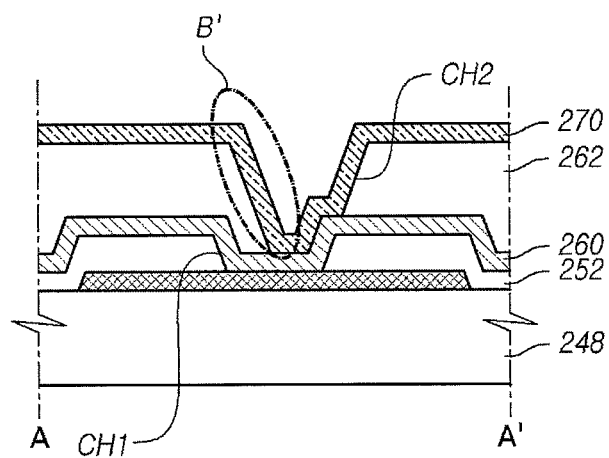

FIG. 3A is a planar view schematically illustrating the pad structure of the general display device. FIGS. 3B and 3C are cross-sectional views illustrating the pad structures of the general display device. FIGS. 3B and 3C are cross-sectional views taken along the line A-A' of FIG. 3A.

Referring to FIGS. 3A to 3C, the pad structure DP of the general display device includes a first metal layer 250 located on the substrate 248, a first insulating layer 252 located on the first metal layer 250 and having a first contact hole CH1, a second metal layer 260 located on the first insulating and the first metal layer 250 which is exposed through the first contact hole CH1, a second insulating layer 262 located on the second metal layer 260 and having a second contact hole CH2, and a third metal layer 270 located on the second insulating 262 and the second metal layer 260 which is exposed through the second contact hole CH2.

Here, the first metal layer 250 may be formed by the same process of the gate line GL of the active area AA. The second metal layer 260 may be formed by the same process of the data line DL. The third metal layer 270 may be formed by the same process of the pixel electrode of the active layer AA.

The first and the second insulating layers 252 and 262 may be comprised of SiOx, SiNx and the like.

Meanwhile the first and the second contact holes are substantially overlapped with each other. As the display device becomes larger and the width of the non-active area in the display panel becomes smaller, various signal lines GL and DL, link lines 220 and 240, and various lines formed in the manner of the Line On Glass (LOG) become narrower in width and overlapped contact holes CH1 and CH2 may cause defects in the panel 140 by the design margin shortage.

FIG. 3B illustrates an alignment error of the mask in the manufacturing process of the first and the second metal layers 250 and 260.

In detail, after the first insulating layer 252 is formed on the first metal layer 250, the first contact hole is formed in order to connect the first and the second metal layers 250 and 260 with each other. The first insulating layer 252 is etched through the mask. At this time, if the position of the mask is not accurately aligned, a first contact hole CH1 can be formed at an area different from the design position.

There is a problem in this case in that a contact region B of the first and the second metal layers 250 and 260 is decreased so that the contact resistance may be increased. In other words, to solve the above described problem, the width of the first metal layer 250 needs to be increased to ensure a sufficient design margin W1 in FIG. 3A. For example, if the display device 100 is the organic light emitting display device, because a plurality of data line DL, gate line GL and link lines 220 and 240 are formed thereon, a sufficient design margin W1 of the pad structure may not be secured.

Meanwhile, FIG. 3C is a view illustrating an alignment error of the mask in the manufacturing process of the second metal layer 260 and the third metal layer 270.

In detail, when the second contact hole CH2 is formed in the second insulating layer 262 formed on the second metal layer 260, the mask may be misaligned with the design position so that it may be formed at an area different from the design position.

In this case, the contact region of the second and the third metal layers 260 and 270 are decreased to increase the contact resistance. As shown in FIG. 3C, the slope of the second contact hole CH2 becomes relatively steep to cause a disconnection defect in the third metal layer. In other words, in the process of forming the third metal layer 270, the third metal layer 270 may be disconnected at a relatively steep area B'. This makes the third metal layer electrically disconnected with the second layer 260 and the design margin not secured.

The pad structure DP and the display device 100 including the same, will be described below with reference to the figures.

Figure 4:
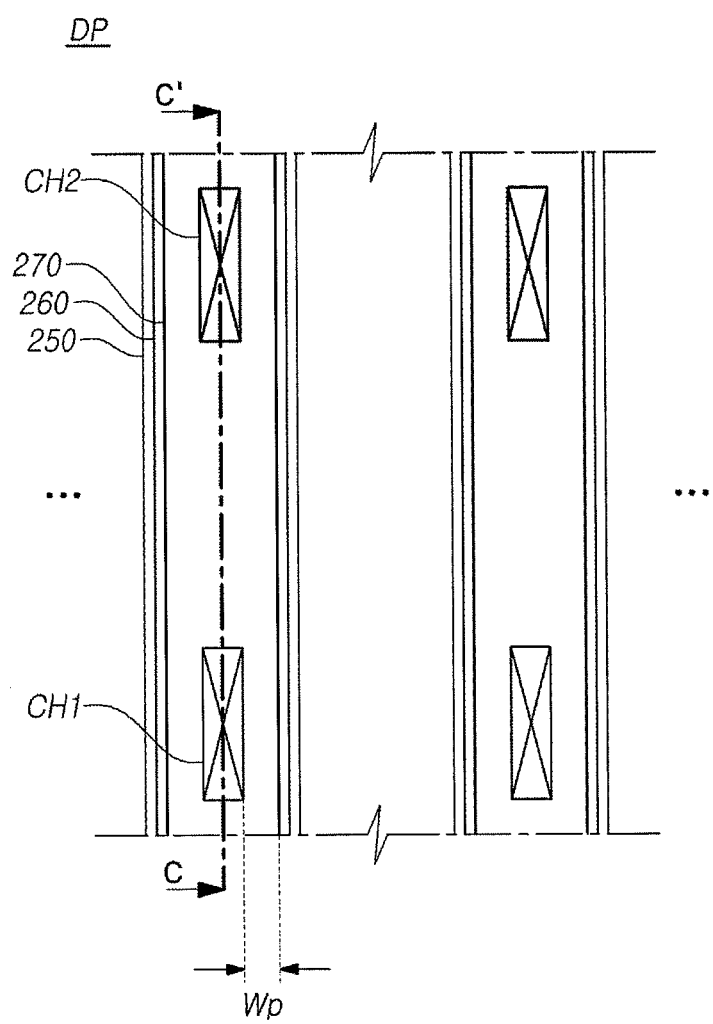
FIG. 4 is a planar view schematically illustrating the pad structure of the display device according to one embodiment of the present invention.
Figure 5:
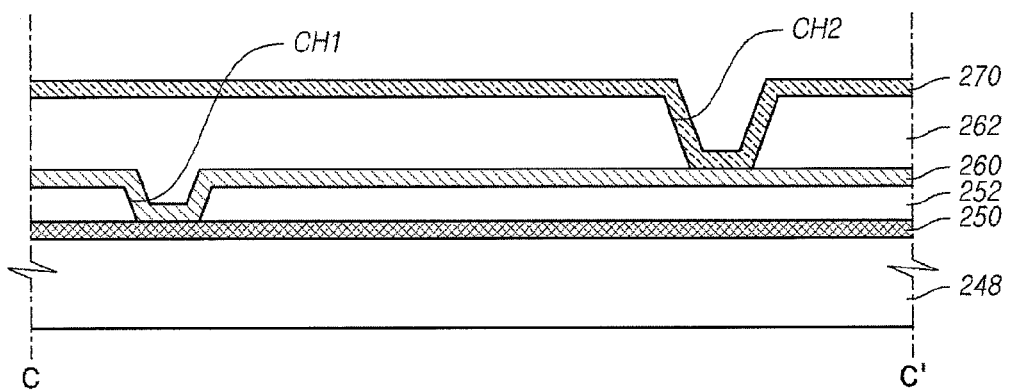
FIG. 5 is a cross-sectional view taken along line C-C' of FIG. 4.

FIG. 4 is a planar view schematically illustrating the pad structure of the display device according to one embodiment. FIG. 5 is a cross-sectional view taken along line C-C' of FIG. 4.

Referring to FIGS. 4 and 5, the display device 100 includes a plurality of the signal lines GL and DL arranged in the active area AA of the substrate 248, and the pad structure DP which is located in the non-active area NA of the substrate and connected with the signal lines.

Here, the plurality of the signal lines GL and DL include the data line DL and the gate line GL which is crossed over each other in the active area AA.

The pad structure DP of the general display device according to one embodiment includes a plurality of the metal layers such as the first metal layer 250, the second metal layer 260 and the third metal layer 270. The first metal layer 250 and the second metal layer 260 are connected with each other through the first contact hole CH1 located in the first insulating layer 252 between the first metal layer 250 and the second metal layer 260. The second metal layer 260 and the third metal layer 270 are connected with each other through the second contact hole CH2 located in the second insulating layer 262 between the second metal layer 260 and the third metal layer 270. The location of the first contact hole CH1 may be different from that of the second contact hole CH2.

More specifically, the pad structure DP may be the data pad structure which is connected with the data line among the plurality of the signal lines GL and DL. Although the pad structure according to various embodiments may be referred to as the data pad structure for simplification, it is not limited thereto. The pad structure according to various embodiments may be applied to the gate pad.

The pad structure may mean the portion which is located in one end of the non-active area NA and connected with the data driving chip film 210 on which the data driving chip 212 is built as illustrated in FIG. 2.

Meanwhile, the first metal layer 250 may perform the function of connecting the pad structure DP to the data line DL. The first metal layer 250 may be a link line 220 to electrically connect the second metal layer 260 to the data line DL among the plurality of the signal lines GL and DL. That is, the first metal layer 250 may mean an end portion of one side of the link line 220. The first metal layer 250 may be also formed by the same process of the gate line GL of the active area AA. The first metal layer 250 may be made of the same material as the gate line GL of the active area AA such as Cu, Mo and the like. The first metal layer 250 may be contacted to the data line DL through the first contact hole CH1 at the portion adjacent to the active area AA.

The second metal layer 260 may be formed by the same process of the data line DL. The second metal layer 260 may be made of the same material as the gate line GL of the active area AA such as Cu, Mo and the like. The second metal layer 260 may be or may not be connected with the data line DL of the active area AA. When the second metal layer 260 is connected with the data line DL, it may perform the function of connecting the first metal layer 250 along with the pad structure DL to the data line DL, thereby reducing the resistance to a current. Both the first and the second metal layers 250 and 260 may be contacted to the data line because they may function as a thicker single line.

The third metal layer 270 may be electrically connected with the second metal layer 260 and the data driving chip film 210 bonded in the non-active area NA of the substrate 248 by an adhesive part including a plurality of the conductive balls. In the manner of the Chip On Film (COF), the third metal layer 270 may perform the function of connecting the data driving chip film 210 built in the data driving chip 212 with the data line DL. The third metal layer 270 may be formed by the same process of the pixel electrode of the active layer AA. The third metal layer 270 may be made of the same material as the pixel electrode of the active area AA, for example, transparent material such as ITO (Indium Tin Oxide) and the like.

Meanwhile, the first and the second metal layers 250 and 260 are electrically connected with each other through the first contact hole CH1 located in the first insulating layer 252. The second and the third metal layers 260 and 270 are electrically connected with each other through the second contact hole CH2 located in the second insulating layer 262.

Here, it is designed that the first contact hole CH1 and the second contact hole CH2 are not overlapped. That is, the location of the first contact hole CH1 is different from that of the second contact hole CH2.

In other words, the first contact hole CH1 may be located at an area adjacent to the active area AA in FIG. 4. The second contact hole CH2 may be located at an area adjacent to one end side of the substrate 248 in FIG. 4. The display device 100 according to various embodiments may include the first contact hole CH1 and the second contact hole CH2 having various shape, number and location as described below.

It is designed that the first contact hole CH1 and the second contact hole CH2 are not overlapped, thereby ensuring a sufficient design margin Wp for contact.

In other words, the above described embodiment may solve the problem that the contact resistance is increased to generate disconnection defects caused by the minimization of the contact hole size and the insufficient design margin of the contact holes CH1 and CH2.

More specifically, the contact holes CH1 and CH2 need to be minimized according to the slimming of all signal lines and the integration of the component elements. When the contact region between the plurality of metal layers 250, 260 and 270 is not sufficiently secured by an alignment error of the mask in the manufacturing process, the contact resistance may be increased. When the contact holes CH1 and CH2 are formed at an area different from the design position to induce the relatively steep step, at least one of metal layers 250, 260 and 270 may be disconnected or poor contact between metal layers may occur.

The pad structure DP of the display device 100 according to an embodiment is that the first and the second contact holes CH1 and CH2 are separated from each other to ensure a sufficient design margin Wp in the manufacturing process, thereby preventing the above described problem in spite of an alignment error of the mask.

Figure 6:
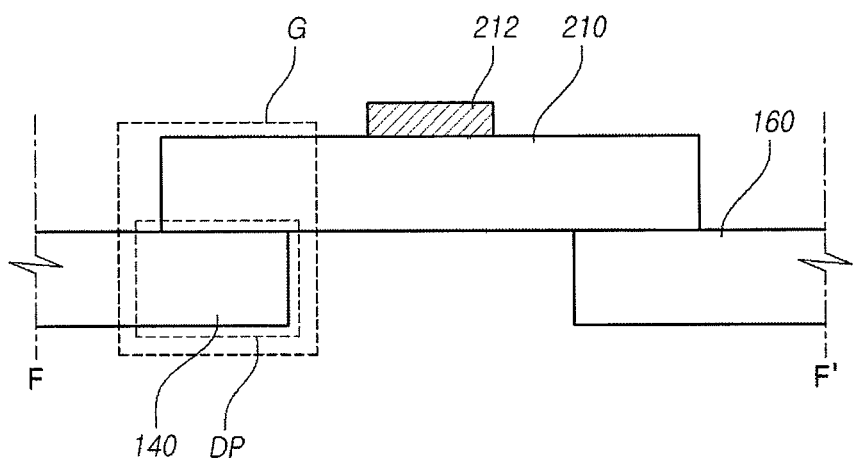
FIG. 6 is a cross-sectional view taken along line F-F' of the portion of "E" in FIG. 2.
Figure 7:
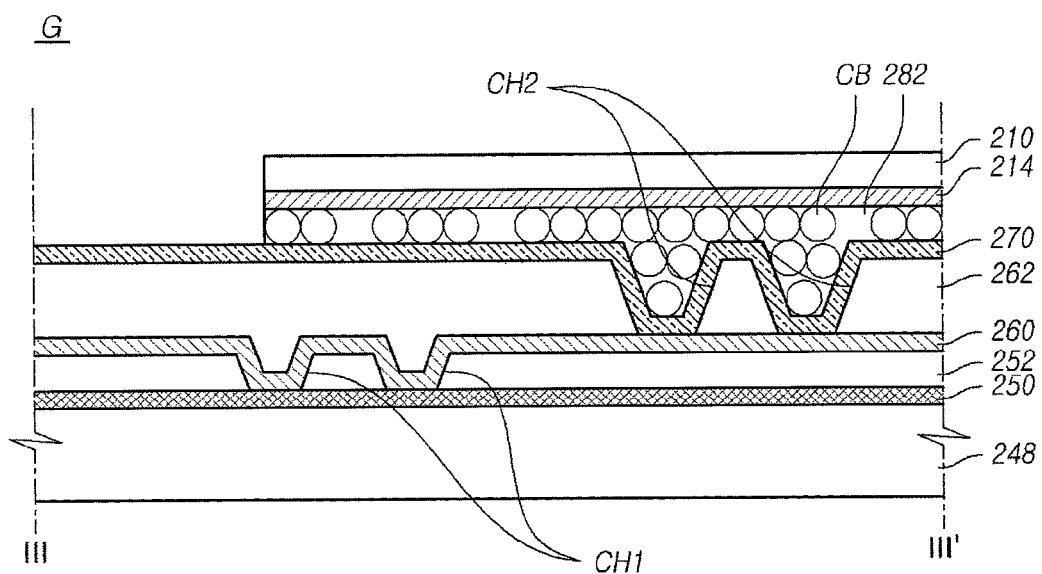
FIG. 7 is a cross-sectional view enlarging the portion of "G" in FIG. 6.

FIG. 6 is a cross-sectional view taken along line F-F' of the portion of "E" in FIG. 2. FIG. 7 is a cross-sectional view enlarging the portion of "G" in FIG. 6.

Referring to FIGS. 6 and 7, the display device 100 may include the display panel 140, the pad structure DP located in the non-active area NA of the display panel 140, the data driving chip film 210 on which the data driving chip 212 connected with the pad structure DP is built, and the source printed circuit board 160 of which an end of one side is connected with the data driving chip film 210 and located to be corresponded with the display panel 140.

The pad structure DP may include the first metal layer 250 located on the substrate 248, two first contact holes CH1, and the second metal layer 260 connected with the first metal layer 250 through the first contact hole CH1. The pad structure DP may include the third metal layer 270 connected with the second metal layer 260 through two second contact hole CH2 located on the second metal layer 260.

The third metal layer 270 may be electrically connected with the second metal layer 260 and the data driving chip film 210 located in the non-active area NA of the substrate 248 by an adhesive part including the plurality of the conductive balls.

In this specification, the driving chip 212 may be a data driving chip or a source driving integrated circuit 212, but it is not limited thereto. The film 210 on which the driving chip 212 is built may be a data driving chip film 210, but it is not limited thereto.

As shown in FIG. 7, the first contact hole CH1 and the second contact hole CH2 may be plural, respectively. The locations of the first contact hole CH1 and the second contact hole CH2 may be different from each other. The second contact hole CH2 may be located adjacent to an end of one side of the display panel 140.

A film line 214 in the manner on the Line On Film (LOF) may be located on the data driving chip film 210. This film line 214 may be contacted and bonded with the pad structure DP.

The pad structure DP and the data chip driving film 210 may be bonded with each other through an adhesive part including the conductive ball CB. Here, the adhesive part 282 may be, for example, an anisotropic conductive film (ACF), but it is not limited thereto.

The third metal layer 270 may be electrically connected to the data driving chip 212 through the conductive ball CB. In detail, the conductive ball CB is dispensed on the third metal layer 270 and the second contact hole CH2 by heat-pressing according to the manner of TAB (Tape Automated Bonding) to electrically connect the data driving chip film 210 and the third metal layer 270 with each other.

At this time, there is an problem in that the disconnection defect between the data pad DP and the data driving chip film 210 does occur according to the electrical connection state of the conductive ball CB. That is, the electrically connection state of the conductive ball CB may vary according to the state when the conductive ball CB is pressed. For example, when the conductive ball CB has not reached to be fully pressed, the contact resistance may be generated between the film line 214 of the data driving chip film 210 and the third metal layer 270 so that the disconnection defect between the data pad DP and the data driving chip film 210 may occur.

The size of the first contact hole CH1 and the second contact hole CH2 may be about 6 μm to 8 μm. The diameter of the conductive ball CB may be about 1 μm to 3 μm, more preferably 2 μm. The step at an area where the first and the second contact holes CH1 and CH2 are overlapped becomes steeply inclined so that the conductive ball CB may be not at all or fully pressed.

On the other hand, the first and the second contact holes CH1 and CH2 in the display device 100 according to various embodiments are not overlapped with each other so that the step is not relatively steeply inclined. Therefore the conductive ball CB may be fully pressed, thereby preventing the contact resistance from being increased.

Various examples of the pad structure according to another embodiment will be described below with reference to the figures.

Figure 8A:
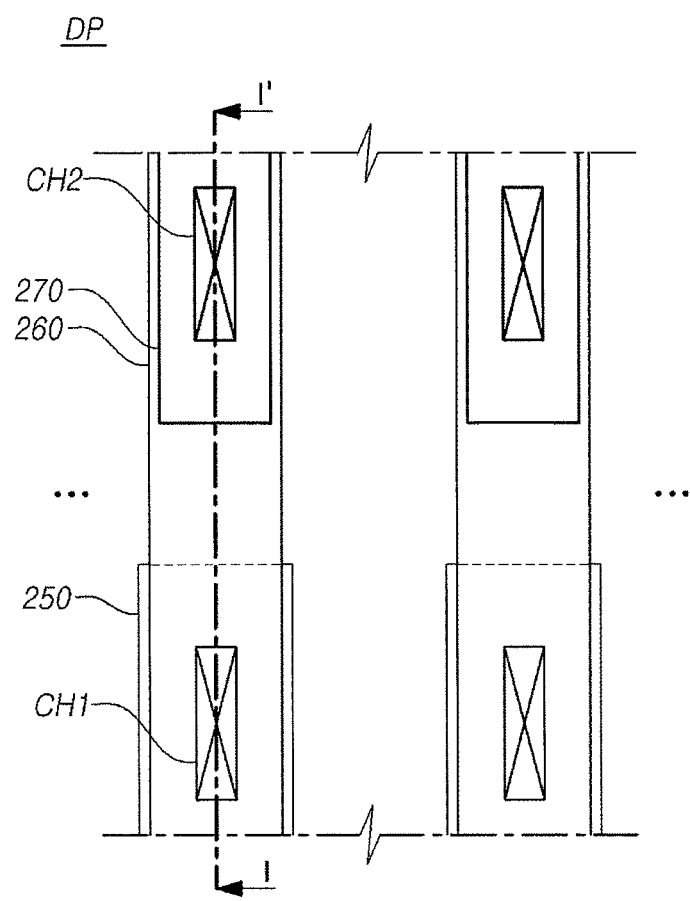
FIG. 8A is a planar view schematically illustrating the pad structure of the display device according to another embodiment of the present invention.
Figure 8B:
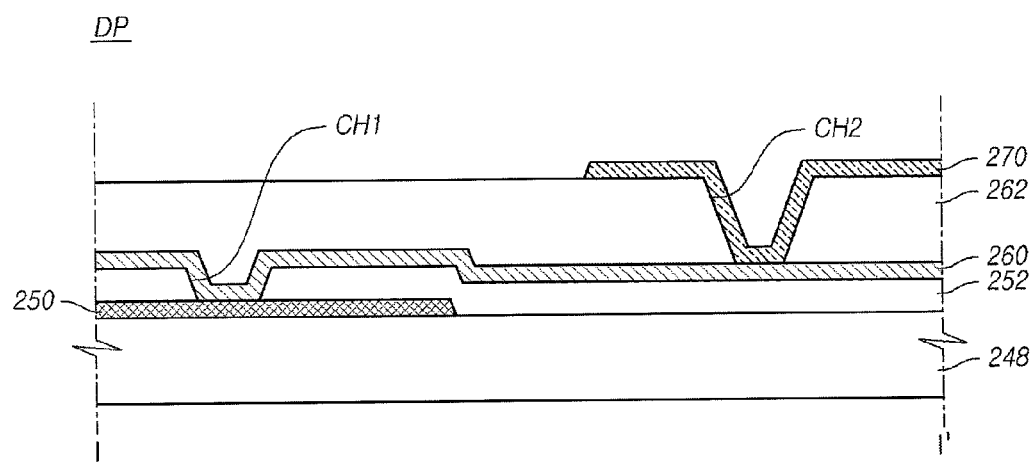
FIG. 8B is a cross-sectional view taken along line I-I' of FIG. 8A.

FIG. 8A is a planar view schematically illustrating the pad structure of the display device according to the other embodiment. FIG. 8B is a cross-sectional view taken along line I-I' of FIG. 8A.

Referring to FIGS. 8A and 8B, the location of the first metal layer 250 and the first contact hole CH1 may be different from that of the second contact hole CH2 in the pad structure of the display device 100.

More specifically, the first metal layer 250 may be located at the area not corresponding to the third metal layer 270. As a result, the first contact hole CH1 and the second contact hole CH2 are separated from each other. Because the third metal layer 270 is contacted with the data driving chip film 210, the first contact hole CH1 and the second contact hole CH2 may be respectively located on an area adjacent to the active area AA and an area adjacent to one end side of the substrate 248. The second metal layer 260 may become a medium to connect the first metal layer 250 and the third metal layer 270.

In this case, the first and the third metal layers 250 and 270 are not overlapped with each other to effectively decrease the entire thickness of the pad structure DP. Because the first contact hole CH1 and the second contact hole CH2 are separated from each other, it is possible to secure a sufficient design margin in the manufacturing process.

Figure 9A:
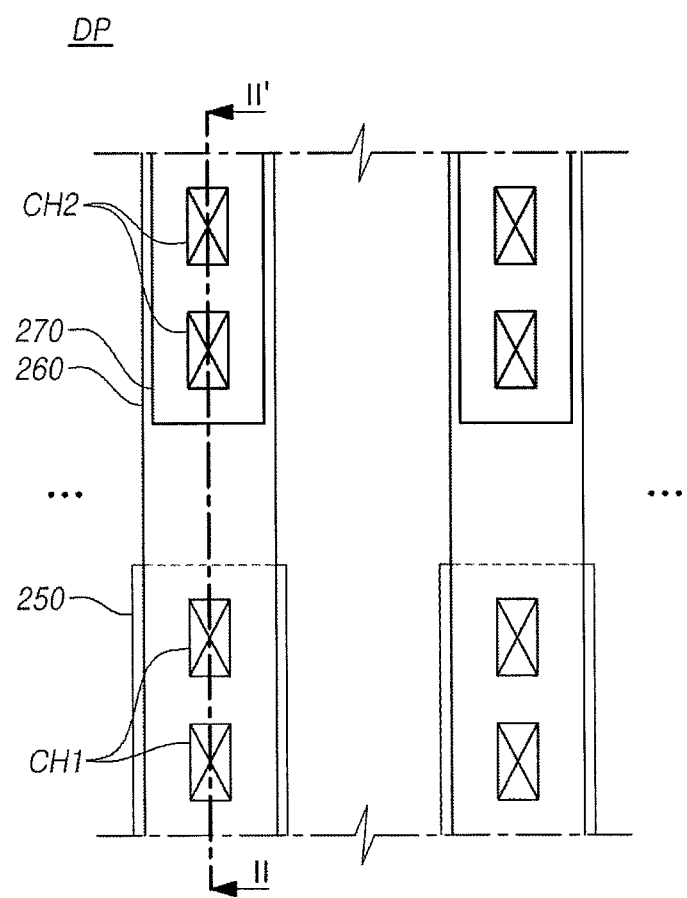
FIG. 9A is a planar view schematically illustrating the pad structure of the display device according to another embodiment of the present invention.
Figure 9B:
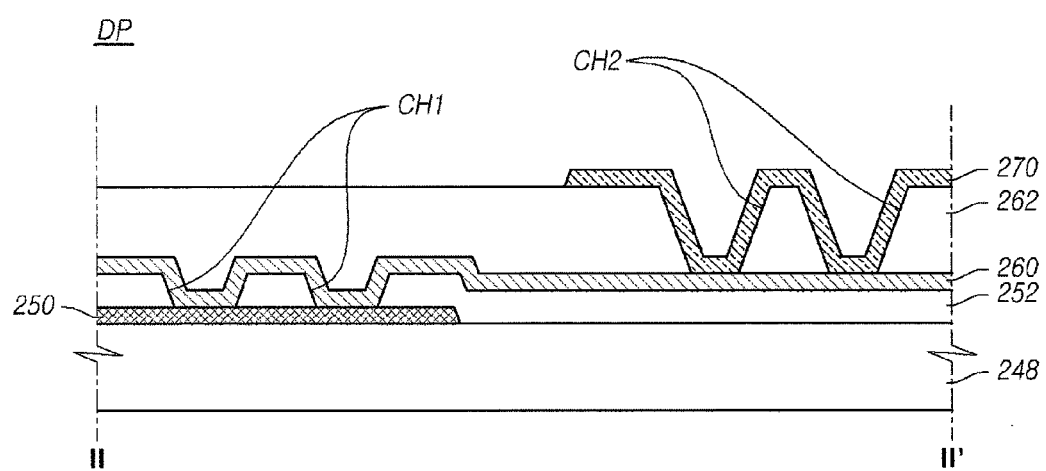
FIG. 9B is a cross-sectional view taken along line II-II' of FIG. 9A.

FIG. 9A is a planar view schematically illustrating the pad structure of the display device according to another embodiment. FIG. 9B is a cross-sectional view taken along line II-II' of FIG. 9A.

Referring to FIGS. 9A and 9B, the location of the first metal layer 250 and the first contact hole CH1 may be different from that of the second contact hole CH2 in the pad structure of the display device 100. The first contact hole CH1 and the second contact hole CH2 may be respectively plural, for example, two.

In this embodiment, a contact region between the first metal layer 250 and the second metal layer 260 and a contact region between the second metal layer 260 and the third metal layer 270 are respectively increased so that the contact resistance may be decreased. Although the contact defect and disconnection at a portion of the contact regions occurs, the increase of the contact regions may result in maintaining the contact.

Figure 10A:
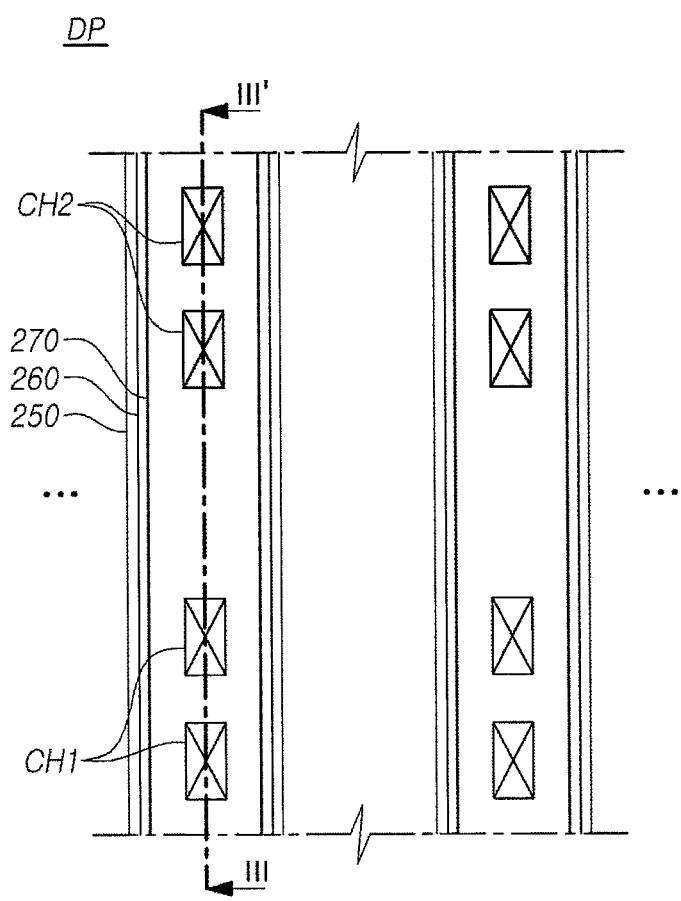
FIG. 10A is a planar view schematically illustrating the pad structure of the display device according to another embodiment of the present invention.
Figure 10B:
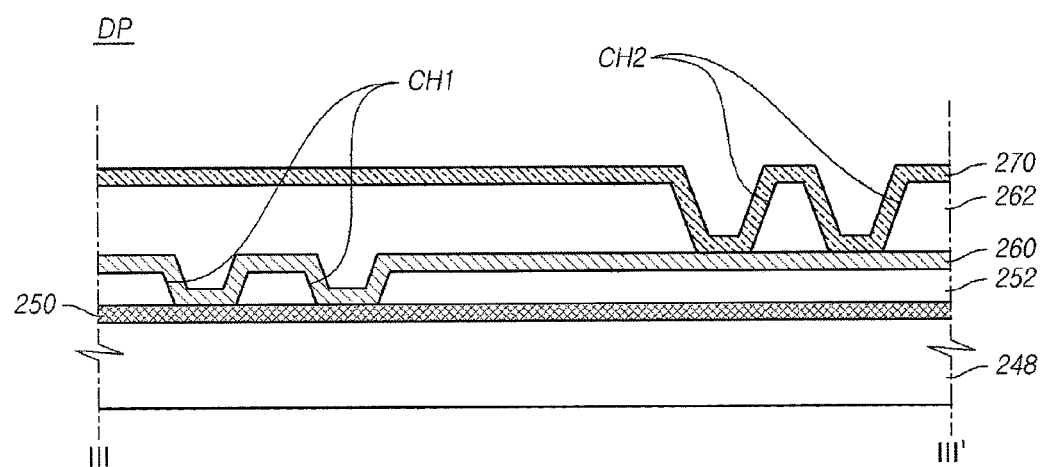
FIG. 10B is a cross-sectional view taken along line of FIG. 10A.

FIG. 10A is a planar view schematically illustrating the pad structure of the display device according to another embodiment. FIG. 10B is a cross-sectional view taken along line of FIG. 10A.

Referring to FIGS. 10A and 10B, the location of the first metal layer 250 and the first contact hole CH1 may be different from that of the second contact hole CH2 in the pad structure of the display device 100. In other words, the first metal layer 250 and the third metal layer 270 may be not separated from each other and sequentially deposited in the pad structure.

The display device 100 including this pad structure DP has an advantage of ensuring a sufficient contact margin because the first contact hole CH1 and the second contact hole CH2 are sufficiently separated from each other in the manufacturing process.

Figure 11A:
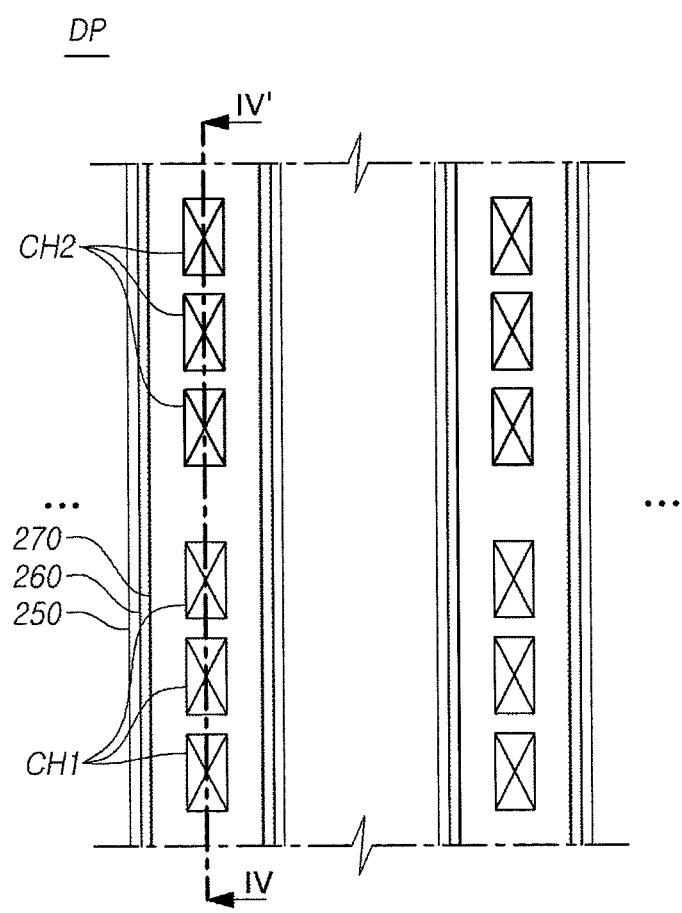
FIG. 11A is a planar view schematically illustrating the pad structure of the display device according to another embodiment of the present invention.
Figure 11B:
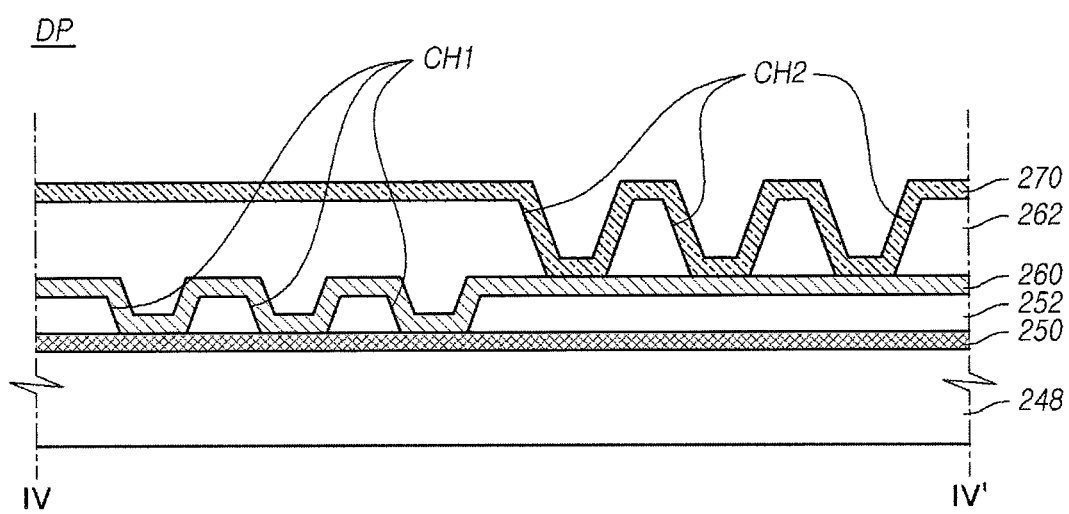
FIG. 11B is a cross-sectional view taken along line IV-IV' of FIG. 11A.

FIG. 11A is a planar view schematically illustrating the pad structure of the display device according to another embodiment. FIG. 11B is a cross-sectional view taken along line IV-IV' of FIG. 11A.

Referring to FIGS. 11A and 11B, the location of the first metal layer 250 and the first contact hole CH1 may be different from that of the second contact hole CH2 in the pad structure of the display device 100. The first contact hole CH1 and the second contact hole CH2 may be respectively plural, for example, three.

In other words, the first metal layer 250 and the third metal layer 270 may be not separated from each other and sequentially deposited in the pad structure.

In this embodiment, a contact region between the first metal layer 250 and the second metal layer 260 and a contact region between the second metal layer 260 and the third metal layer 270 are respectively increased so that the contact resistance may be decreased. Although defective contacts or disconnection at a portion of the contact regions may occur, the contact between the metal layers can be maintained due to the increased contact region.

Figure 12A:
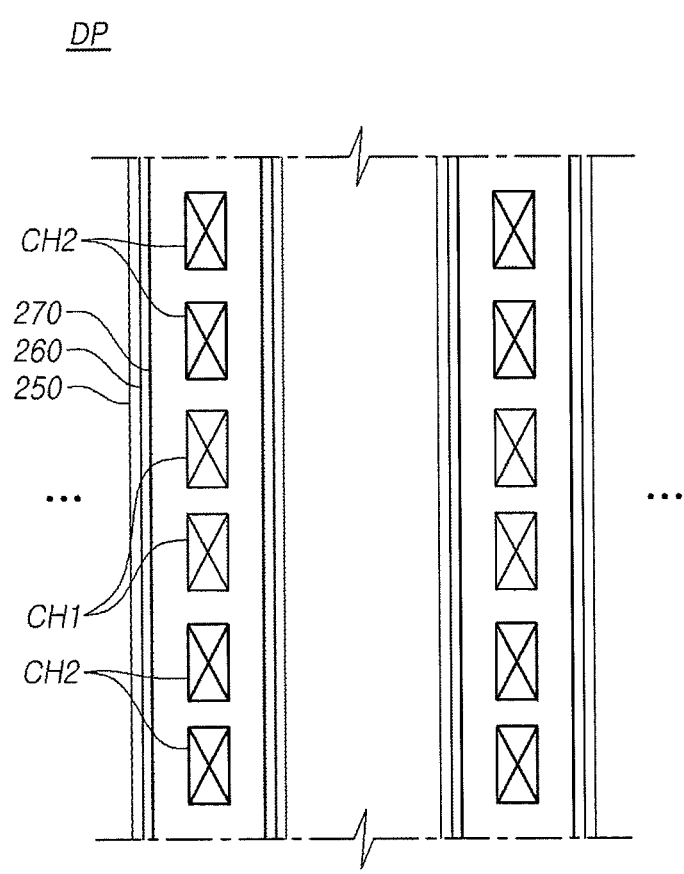
FIGS. 12A and 12B are planar views schematically illustrating the pad structure of the display device according to another embodiment of the present invention.
Figure 12B:
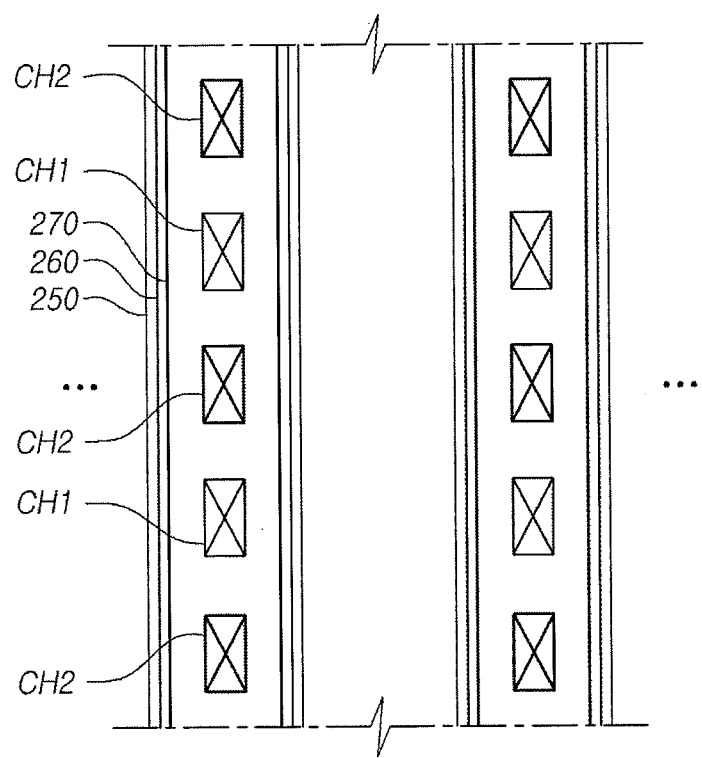

FIGS. 12A and 12B are planar views, i.e. the contact holes when viewed from above, schematically illustrating the pad structure of the display device according to another embodiment.

Referring to FIGS. 12A and 12B, the first contact hole CH1 and the second contact hole CH2 are alternately arranged along a line. In further detail, one or more of the first contact holes CH1 and the second contact holes CH2 may be respectively grouped and alternately arranged along a line.

Here, the location of the first metal layer 250 and the first contact hole CH1 may be different from that of the second contact hole CH2 in the pad structure of the display device 100.

Figure 13A:
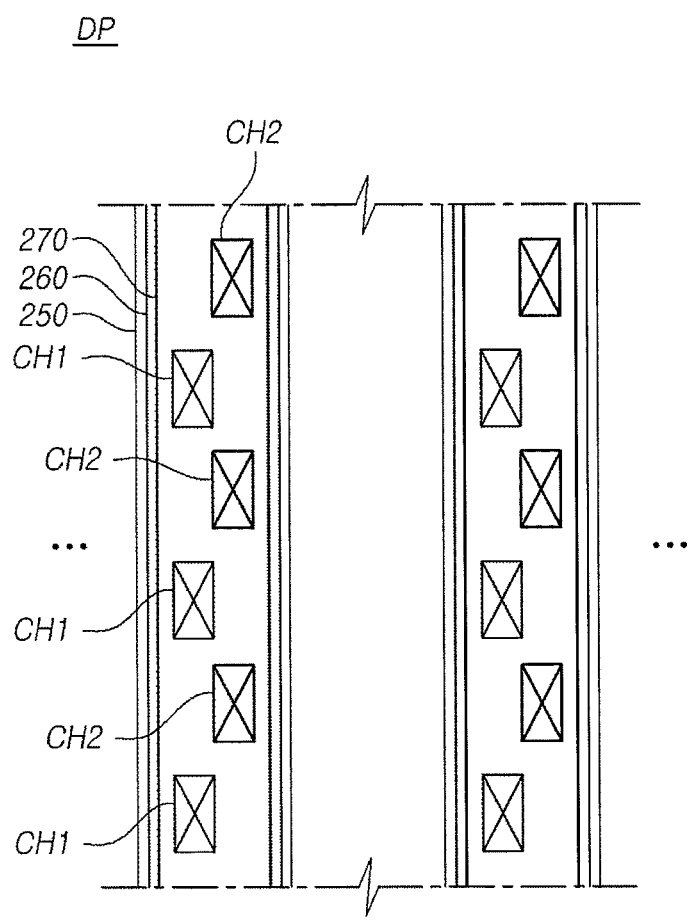
FIGS. 13A and 13B are planar views schematically illustrating the pad structure of the display device according to another embodiment of the present invention.
Figure 13B:
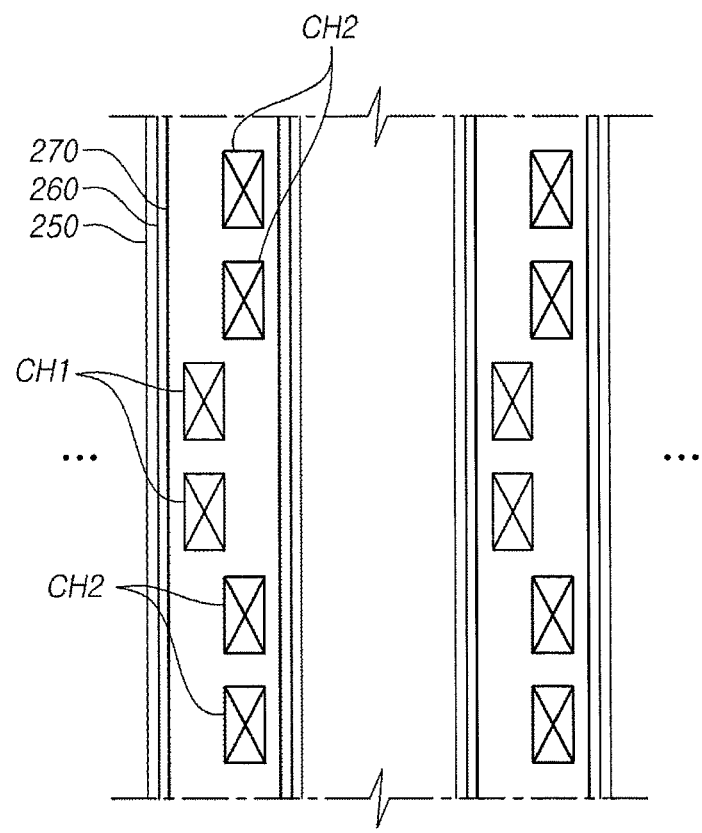

FIGS. 13A and 13B are planar views schematically illustrating the pad structure of the display device according to another embodiment.

Referring to FIGS. 13A and 13B, the first contact hole CH1 and the second contact hole CH2 are alternately arranged along a line in a zigzag manner. Specifically, one or more of the first contact hole CH1 and the second contact hole CH2 are respectively grouped and arranged in the zigzag manner. Although not described in the figures, the first contact hole CH1 and the second contact hole CH2 are arranged in an irregular zigzag manner.

The arrangement of the first contact hole CH1 and the second contact hole CH2 in the zigzag manner may make them fully separated with each other, thereby ensuring a sufficient design margin.

Similar to the above embodiments, the increase of contact region between the metal layers 250, 260 and 270 may result in the decreased contact resistance, thereby improving the reliability of the pad structure DP and the display panel 100.

As described above, the pad structure DP may include three metal layers 250, 260 and 270, two insulating layers 252 and 262 are respectively located between two of them, and two contact holes CH1 and CH2 respectively located in the insulating layers 252 and 262 are not overlapped with each other. However the present invention is not limited thereto. For example, the pad structure DP may include four or more metal layers and three or more insulating layers. As described above, the first contact hole CH1 and the second contact hole CH2 may have various shape, various number and various location.

Figure 14A:
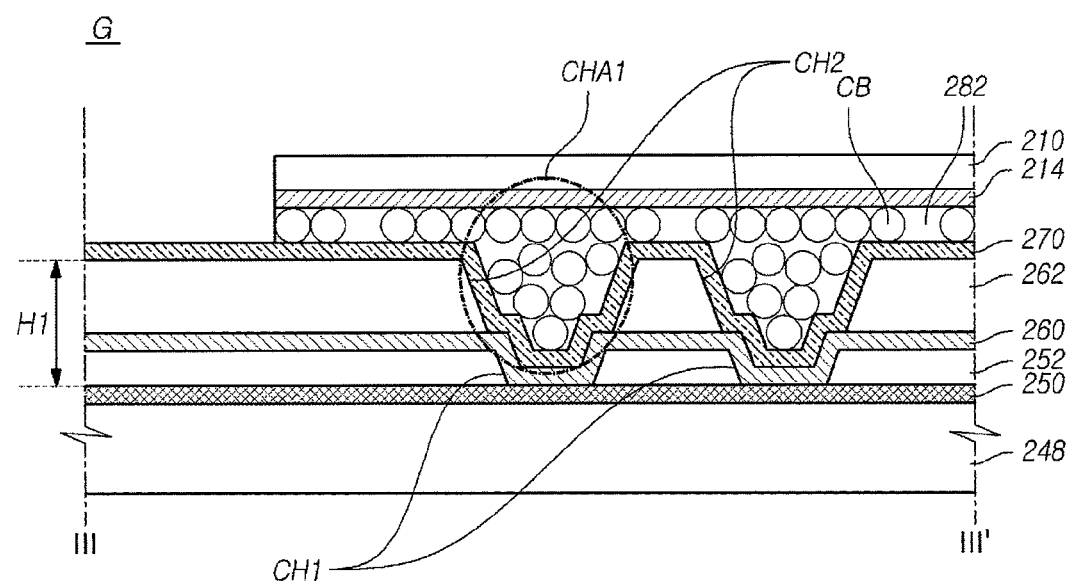
FIG. 14A is a cross-sectional view illustrating the pad structure and the data driving chip film of general display device.
Figure 14B:
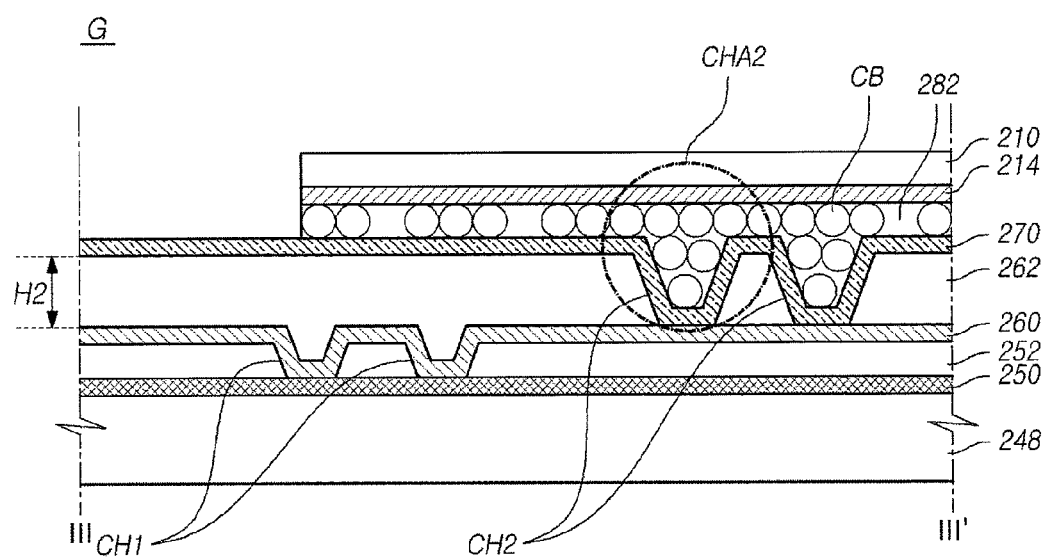
FIG. 14B is a cross-sectional view illustrating the pad structure and the data driving chip film of the display device according to various embodiments of the present invention.

FIG. 14A is a cross-sectional view illustrating the pad structure and the data driving chip film of general display device. FIG. 14B is a cross-sectional view illustrating the pad structure and the data driving chip film of the display device according to various embodiments.

Referring to FIG. 14A, the pad structure DP and the data chip driving film 210 may be bonded with each other through an adhesive part 282 including the conductive ball CB.

The third metal layer 270 may be electrically connected to the data driving chip 212 through the conductive ball CB. In detail, the conductive ball CB is dispensed on the third metal layer 270 and the second contact hole CH2 by heat-pressing according to the manner of TAB (Tape Automated Bonding) to electrically connect the data driving chip film 210 and the third metal layer 270 with each other.

In case of general display device 100, because the contact holes CH1 and CH2 are overlapped with each other, the step difference H1 at an area where the first and the second contact holes CH1 and CH2 are overlapped becomes relatively large so that the conductive ball CB disposed in the contact hole formation area CHA1 may not be fully pressed. Therefore, the contact resistance may be increased between the film line 214 of the data driving chip film 210 and the third metal layer 270 such that the disconnection defect between the pad structure DP and the data driving chip film 210 may occur.

Meanwhile, referring to FIG. 14B, the first and the second contact holes CH1 and CH2 in the display device 100 according to various embodiments are not overlapped with each other so that the step difference H2 in the contact hole formation area CHA2 is relatively small may be not relatively steeply inclined. Therefore, the conductive ball CB may be fully pressed, thereby preventing the contact resistance from being increased and improving the reliability of the pad structure DP in the display panel 100 by the stable connection made between the pad structure DP and data driving chip film 210.

In summary, it may be designed for the pad structure DP of the display device 100 that the first and the second contact holes CH1 and CH2 are not overlapped with each other so as to ensure a sufficient design margin and improve the reliability of the process of forming the contact holes CH1 and CH2 by reducing the step difference in the contact hole formation area CHA2, thereby reducing the contact resistance.

Although various embodiments have been described up to now with reference to the accompanying drawings, the present invention is not limited to thereto.

As to one embodiment, a display device may comprises a plurality of signal lines including a data line and a gate line arranged in a display area of a substrate and a pad structure located at a non-active area of the substrate and connected with the signal lines, wherein the pad structure comprises two or more metal layers, and an insulating layer located between the metal layers and having one or more contact holes which make two metal layers among the metal layers contact each other, and the contact holes respectively located in the insulating layers are not overlapped with each other.

The pad structure may be a data pad structure which is connected with the data line among the plurality of the signal lines.

The pad structure further may comprise a first metal layer, a second metal layer and a third metal layer, the first metal layer and the second metal layer are connected with each other through a first contact hole located in a first insulating layer between the first metal layer and the second metal layer, the second metal layer and the third metal layer are connected with each other through a second contact hole located in a second insulating layer between the second metal layer and the third metal layer, and a location of the first contact hole is different from that of the second contact hole.

The first metal layer may a link line to electrically connect the second metal layer to the data line.

The third metal layer may be electrically connected with the second metal layer and a data driving chip film located in the non-active area of the substrate by an adhesive part including a plurality of conductive balls.

The first metal layer and the first contact hole may be located at an area different from an area where the third metal layer is located.

The first metal layer and the first contact hole may be located at an area corresponding to an area where the third metal layer is located.

The first contact hole may be located at an area adjacent to an active area and the second contact hole is located at an area adjacent to one end side of the substrate.

The signal lines may comprise the data line and the gate line intersecting the data line, the first metal layer is made of a same material as the gate line, the second metal layer is made of a same material as the data line, and the third metal layer is made of a same material as a pixel electrode.

As to other embodiment, a pad structure may comprise a plurality of metal layers; and two or more insulating layers disposed between the metal layers, each insulating layer having one or more contact holes which make two metal layers among the plurality of metal layers contact each other, wherein the contact holes respectively located in each of the insulating layers are not overlapped with each other.

The metal layers may include a fist metal layer, a second metal layer and a third metal layer, and wherein the first metal layer and the second metal layer are connected with each other through a first contact hole located in a first insulating layer between the first metal layer and the second metal layer, the second metal layer and the third metal layer are connected with each other through a second contact hole located in a second insulating layer between the second metal layer and the third metal layer, and a location of the first contact hole is different from that of the second contact hole.

The first metal layer and the first contact hole may be located at an area different from an area where the third metal layer is located.

The first metal layer and the first contact hole may be located at an area corresponding to an area where the third metal layer is located.

The first contact hole and the second contact hole may be alternately arranged.

The first contact hole and the second contact hole may be arranged in a zigzag manner.

As to another, a method for forming a pad structure in a display device may comprise providing a plurality of metal layers on a substrate; and providing two or more insulating layers, each insulating layer being disposed between the metal layers and having one or more contact holes which make two metal layers among the plurality of metal layers contact each other, wherein the contact holes respectively disposed in each of the insulating layers are not overlapped with each other.

The metal layers may include a fist metal layer, a second metal layer and a third metal layer, and wherein the first metal layer and the second metal layer are connected with each other through a first contact hole located in a first insulating layer between the first metal layer and the second metal layer, the second metal layer and the third metal layer are connected with each other through a second contact hole located in a second insulating layer between the second metal layer and the third metal layer, and a location of the first contact hole is different from that of the second contact hole.

The first metal layer and the first contact hole may be located at an area different from an area where the third metal layer is located.

The first contact hole and the second contact hole may be alternately arranged.

The first contact hole and the second contact hole may be arranged in a zigzag manner.

In addition, since terms, such as "including," "comprising," and "having" mean that one or more corresponding components may exist unless they are specifically described to the contrary, it shall be construed that one or more other components can be included. All the terms that are technical, scientific or otherwise agree with the meanings as understood by a person skilled in the art unless defined to the contrary. A term ordinarily used like that defined by a dictionary shall be construed that it has a meaning equal to that in the context of a related description, and shall not be construed in an ideal or excessively formal meaning unless it is clearly defined in the present specification.

Although the embodiments of the present invention have been described for illustrative purposes, those skilled in the art will appreciate that various modifications, additions and substitutions are possible, without departing from the scope of the invention. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. A display device, comprising:
    a plurality of signal lines including a data line and a gate line arranged in a display area of a substrate; and
    a pad structure located at a non-active area and connected with the signal lines, wherein the pad structure further comprises:
    a plurality of metal layers including a first metal layer, a second metal layer and a third metal layer,
    wherein the first metal layer and the second metal layer are connected with each other through a first contact hole located in a first insulating layer between the first metal layer and the second metal layer,
    the second metal layer and the third metal layer are connected with each other through a second contact hole located in a second insulating layer between the second metal layer and the third metal layer, and
    the first contact hole and the second contact hole are not overlapped with each other.

2. The display device of claim 1,
    wherein the pad structure is a data pad structure which is connected with the data line among the plurality of the signal lines.

3. The display device of claim 1,
    wherein the first metal layer is a link line to electrically connect the second metal layer to the data line.

4. The display device of claim 1,
    wherein the third metal layer is electrically connected with the second metal layer, and
    the third metal layer is electrically connected to a data driving chip film located in the non-active area of the substrate by an adhesive part including a plurality of conductive balls.

5. The display device of claim 1, wherein the first contact hole is located at an area adjacent to the display area and the second contact hole is located at an area adjacent to one end side of the substrate.

6. The display device of claim 1, wherein the first metal layer is made of a same material as the gate line, the second metal layer is made of a same material as the data line, and the third metal layer is made of a same material as a pixel electrode.

7. A pad structure, comprising:
a plurality of metal layers including a first metal layer, a second metal layer and a third metal layer,
wherein the first metal layer and the second metal layer are connected with each other through a first contact hole located in a first insulating layer between the first metal layer and the second metal layer,
the second metal layer and the third metal layer are connected with each other through a second contact hole located in a second insulating layer between the second metal layer and the third metal layer, and
the first contact hole and the second contact hole are not overlapped with each other.

8. The pad structure of claim 7, wherein the first metal layer and the first contact hole are not overlapped with the third metal layer.

9. The pad structure of claim 7, wherein the first metal layer and the first contact hole overlap with the third metal layer.

10. The pad structure of claim 1, wherein the first contact hole, or the second contact hole, or both the first contact hole and the second contact hole are a plurality of contact holes.

11. The pad structure of claim 10, wherein the first contact hole and the second contact hole are arranged in a zigzag manner.

12. The pad structure of claim 10, wherein the first contact hole and the second contact hole are alternately arranged along a line.

13. The pad structure of claim 12, wherein the first contact hole, or the second contact hole, or both the first contact hole and the second contact hole are offset from the line when the contact holes are viewed from above.

* * * * *